(12) United States Patent
Matsumoto et al.

(10) Patent No.: US 10,476,445 B2
(45) Date of Patent: *Nov. 12, 2019

(54) SYSTEMS AND METHODS FOR IMPROVED POWER YIELD AND LINEARIZATION IN RADIO FREQUENCY TRANSMITTERS

(71) Applicant: Aviat U.S., Inc., Milpitas, CA (US)

(72) Inventors: Frank Matsumoto, San Ramon, CA (US); Youming Qin, Sunnyvale, CA (US); David C. M. Pham, Fremont, CA (US); Jayesh Nath, Milpitas, CA (US); Ying Shen, Chapel Hill, NC (US)

(73) Assignee: Aviat U.S., Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/907,218

(22) Filed: Feb. 27, 2018

(65) Prior Publication Data
US 2018/0191311 A1 Jul. 5, 2018

Related U.S. Application Data

(63) Continuation of application No. 15/156,832, filed on May 17, 2016, now Pat. No. 9,906,194, which is a (Continued)

(51) Int. Cl.
*H04B 1/04* (2006.01)
*H03F 1/32* (2006.01)
(Continued)

(52) U.S. Cl.
CPC ............ *H03F 1/32* (2013.01); *H03F 1/0205* (2013.01); *H03F 1/0211* (2013.01);
(Continued)

(58) Field of Classification Search
CPC .... H03F 1/0222; H03F 1/0233; H03F 1/0266; H03F 1/0272; H03F 1/32; H03F 1/3241;
(Continued)

(56) References Cited

U.S. PATENT DOCUMENTS 5,237,288 A 8/1993 Cleveland
5,420,536 A 5/1995 Faulkner
(Continued)

OTHER PUBLICATIONS

Wikimedia Foundation, Inc., "Linear Regulator," Wikipedia online encyclopedia entry, Aug. 27, 2010 [retrieved from http://en.wikipedia.org/w/index.php?title=Linear_regulator&oldid=381273351 on May 6, 2015].

(Continued)

*Primary Examiner* — Quochien B Vuong
(74) *Attorney, Agent, or Firm* — Sheppard, Mullin, Richter & Hampton LLP

(57) ABSTRACT

An exemplary system comprises a linearizer module, a first upconverter module, a power amplifier module, a signal sampler module, and a downconverter module. The linearizer module may be configured to receive a first intermediate frequency signal and to adjust the first intermediate frequency signal based on a reference signal and a signal based on a second intermediate frequency signal. The first upconverter module may be configured to receive and up-convert a signal based on the adjusted first intermediate frequency signal to a radio frequency signal. The power amplifier module may be configured to receive and amplify a power of a signal based on the radio frequency signal. The signal sampler module may be configured to sample a signal based on the amplified radio frequency signal. The downconverter module may be configured to receive and down-convert a signal based on the sampled radio frequency signal to the second intermediate frequency signal.

21 Claims, 5 Drawing Sheets

Related U.S. Application Data continuation of application No. 13/277,588, filed on Oct. 20, 2011, now Pat. No. 9,369,094.

(60) Provisional application No. 61/405,148, filed on Oct. 20, 2010.

(51) Int. Cl.
  *H03F 1/02* (2006.01)
  *H03F 3/24* (2006.01)
  *H03F 3/19* (2006.01)
  *H03F 3/21* (2006.01)

(52) U.S. Cl.
  CPC ............. *H03F 1/3247* (2013.01); *H03F 3/19* (2013.01); *H03F 3/21* (2013.01); *H03F 3/245* (2013.01); *H04B 1/04* (2013.01); *H03F 2200/129* (2013.01); *H03F 2200/207* (2013.01); *H03F 2200/451* (2013.01); *H04B 2001/0425* (2013.01)

(58) Field of Classification Search
  CPC ........... H03F 1/3247; H03F 2201/3227; H03F 2201/3233; H04B 1/04; H04B 1/0475; H04B 1/40; H04B 10/2507; H04B 2001/0408; H04B 2001/0425; H04B 2001/0433
  USPC ........... 455/63.1, 67.13, 114.2, 114.3, 115.1, 455/115.2, 126, 127.1, 127.2; 375/295, 375/296
  See application file for complete search history.

(56) References Cited

U.S. PATENT DOCUMENTS

| | | | |
|---|---|---|---|
| 5,524,285 | A | 6/1996 | Wray |
| 6,385,436 | B1 | 5/2002 | Horiguchi |
| 6,445,249 | B1 | 9/2002 | Khan |
| 6,449,465 | B1 | 9/2002 | Gailus |
| 6,587,514 | B1 | 7/2003 | Wright |
| 6,606,483 | B1 | 8/2003 | Baker |
| 6,928,122 | B2 * | 8/2005 | Opas ..................... H03F 1/3247 455/126 |
| 7,058,369 | B1 | 6/2006 | Wright |
| 7,099,636 | B2 | 8/2006 | Rozenblit |
| 7,197,286 | B2 | 3/2007 | Ode |
| 8,260,144 | B2 | 9/2012 | Gupta |
| 8,269,572 | B2 | 9/2012 | Brandt |
| 8,364,101 | B2 | 1/2013 | Shizawa |
| 8,558,616 | B2 | 10/2013 | Shizawa |
| 2003/0020538 | A1 | 1/2003 | Kim |
| 2004/0142667 | A1 | 7/2004 | Lochhead |
| 2006/0012427 | A1 | 1/2006 | Nezami |
| 2009/0232510 | A1 | 9/2009 | Gupta |
| 2009/0311980 | A1 | 12/2009 | Sjoland |

OTHER PUBLICATIONS

Wikimedia Foundation, Inc., "Linearizer," Wikipedia online encyclopedia entry, Apr. 9, 2015 [retrieved from http://en.wikipedia.org/wiki/Linearizer on Jun. 13, 2015].
European Patent Application No. 11835165.9, Partial Search Report dated Mar. 10, 2015.
International Application No. PCT/US2011/057148, International Search Report and Written Opinion dated Jan. 31, 2012.

* cited by examiner

SYSTEMS AND METHODS FOR IMPROVED POWER YIELD AND LINEARIZATION IN RADIO FREQUENCY TRANSMITTERS

CROSS-REFERENCE TO RELATED APPLICATIONS

The present application is a continuation of U.S. patent application Ser. No. 15/156,832, filed May 17, 2016 and entitled "Systems and Methods for Improved Power Yield and Linearization in Radio Frequency Transmitters," now U.S. Pat. No. 9,906,194, which is a continuation of U.S. patent application Ser. No. 13/277,588, filed Oct. 20, 2011 and entitled "Systems and Methods for Improved Power Yield and Linearization in Radio Frequency Transmitters," now U.S. Pat. No. 9,369,094, which claims priority to U.S. Provisional Patent Application Ser. No. 61/405,148, filed Oct. 20, 2010 and entitled "Radio Frequency Transmitter with Improved Yield and Robust Design and Manufacturing Methodology Utilizing Adaptive Amplifier Linearization and an Adaptive DC Bias Control," which are hereby incorporated by reference herein.

FIELD OF THE INVENTION(S)

The present invention(s) generally relate to radio frequency transmitters. More particularly, the invention(s) relate to systems and methods for improving the power yield and linearization of a radio frequency transmitter.

DESCRIPTION OF THE RELATED ART

Radio frequency (RF) transmitters in wireless communications systems (e.g., microwave radio systems) commonly utilize a radio frequency (RF) power amplifier when generating a radio frequency (RF) signal. The RF transmitters also commonly utilize a digital or analog modulation scheme (e.g., quadrature amplitude modulation (QAM), phase-shift keying (PSK), and the like) to modulate data onto the RF signal generated.

FIG. 1 depicts an example of a conventional heterodyne transmitter 100 found in the prior art. The conventional heterodyne transmitter 100 comprises a data signal input terminal 102, a intermediate frequency (IF) upconverter module 104, a radio frequency (RF) upconverter module 106, a radio frequency (RF) power amplifier (PA) 108, and a radio frequency (RF) output terminal 110. Generally, the data signal input terminal 102 is configured to receive a data signal (e.g., one or more baseband signals from a modem) that is intended for transmission and is carrying modulation information (i.e., data). The digital or analog modulation used usually depends on the RF transmitter type.

The intermediate frequency (IF) upconverter module 104 up-converts the data signal to an intermediate frequency (IF) signal. The radio frequency (RF) subsequently up-converts the IF signal to a radio frequency (RF) signal. Traditionally, the center frequency of the RF signal is that of the wireless channel being used by the radio frequency (RF) transmitter during transmission. Thereafter, the radio frequency (RF) power amplifier 108 amplifies the RF signal to a power level that is preferred for transmission. The radio frequency (RF) output terminal 110 eventually provides the resulting, amplified radio frequency (RF) signal to an antenna feed or some other component for transmission.

It is well known in the art that in order to maintain the integrity of an RF signal's modulation (so that the signal can be properly demodulated by a receiver), it is important that the RF power amplifier utilized during power amplification of the RF signal performs with high linearity. In other words, the utilized RF power amplifier should receive and amplify the RF signal to an amplified RF signal that is highly linear with respect to the RF signal the RF power amplifier receives. When the amplified RF signal lacks such linearity, the amplified RF signal may be distorted, which adversely affects the ability of the amplified RF signal to be accurately demodulated. Examples of distortions commonly produced by RF power amplifiers include, without limitation, unintended harmonics in adjacent frequency bands, amplitude distortion (e.g., clipping distortion), and phase distortion.

A number of factors influence the performance capabilities (e.g., linearity performance) of a given radio frequency (RF) power amplifier. Some of these factors include the type of transistors utilized by an RF power amplifier (e.g., GaAs, CMOS, or SiGe), the amplifier architecture utilized by the RF power amplifier (e.g., a class C amplifier architecture typically exhibit less linearity than a class A or a class AB amplifier architecture), ambient temperature around the RF power amplifier, the frequency of the input signal, and the amount of power supplied to the RF power amplifier. Generally speaking, an RF power amplifier performs more optimally in cooler ambient temperatures. With respect to the input signal frequency, typically each RF power amplifier usually has an input frequency range within which the RF power amplifier optimally operates, and outside of which distortion of amplified RF signal results. In addition, usually the more power supplied to the RF power amplifier, the less the distortion exhibited by an RF power amplifier but the more heat dissipated by the RF power amplifier. Conversely, the less the power supplied to the power amplifier, the less the amplification of the amplified RF signal.

Though distortion and/or power efficiency issues relating to radio frequency (RF) power amplifier can often be addressed using higher quality RF power amplifiers (e.g., having better transistors, having better amplifier architecture, requiring less power), such higher quality RF power amplifiers cost more than low end RF power amplifiers.

SUMMARY OF EMBODIMENTS

Various embodiments discussed herein provide systems and methods for improved linearization for radio frequency (RF) transmitters, which may also enable improved power yield for RF transmitters.

An exemplary system comprises a linearizer module, a first upconverter module, a power amplifier module, a signal sampler module, and a downconverter module. The linearizer module may be configured to receive a first intermediate frequency signal and to adjust the first intermediate frequency signal based on a reference signal and a signal based on the second intermediate frequency signal. The first upconverter module may be configured to receive and up-convert a signal based on the adjusted first intermediate frequency signal to a radio frequency signal. The power amplifier module may be configured to receive and amplify a power of a signal based on the radio frequency signal to an amplified radio frequency signal. The signal sampler module may be configured to sample a signal based on the amplified radio frequency signal, thereby resulting in a sampled radio frequency signal. In some embodiments, the signal sampler module may comprise a directional coupler configured to obtain the sampled radio frequency signal. The downconverter module may be configured to receive and down-convert a signal based on the sampled radio frequency signal to the second intermediate frequency signal.

The linearizer module may be further configured to compare the reference signal to the signal based on the second intermediate frequency signal, and detect a distortion of the amplified radio frequency signal based on comparing the reference signal to the second intermediate frequency signal. Additionally, the linearizer module may be further configured to adjust the first intermediate frequency signal in order to reduce the distortion of the amplified radio frequency signal, thereby resulting in the adjusted first intermediate frequency signal.

In some embodiments, the linearizer module may be configured to detect the distortion based on comparing the reference signal to the second intermediate frequency signal by generating an error function from comparing the reference signal to the second intermediate frequency signal. Subsequently, the linearizer module may adjust the first intermediate frequency signal in order to reduce the distortion of the amplified radio frequency signal by adjusting the first intermediate frequency signal using the linearizer module based on the error function. For some embodiments, adjusting the first intermediate frequency signal based on the error function may comprise adjusting the first intermediate frequency signal such that a result of the error function indicates minimal distortion of the amplified radio frequency signal.

In various embodiments, the linearizer module may be further configured to determine a percentage of adjustment applied to the first intermediate frequency signal in order to reduce the distortion of the amplified radio frequency signal. Additionally, the linearizer module may be further configured to generate an alert when the percentage of adjustment applied to the first intermediate frequency signal is greater than or equal to a threshold value.

In certain embodiments, the power amplifier module may comprise a power amplifier, wherein the power amplifier module contributes at least some of the distortion of the amplified radio frequency signal due to an output non-linearity characteristic of the power amplifier or due to a power level supplied to the power amplifier. Depending on the embodiment, the power amplifier module may comprise a class C, a class AB, or a class A power amplifier. Additionally, the power amplifier module may comprise an adjustable power supply module configured to provide an adjustable power level to the power amplifier module. For example, the power amplifier module may be configured to use the adjustable power supply module to reduce the level of power utilized by the power amplifier module. In some embodiments, the adjustable power supply module may adjust a direct current (DC) bias power of the power amplifier module based on the radio frequency (RF) power needed to transmit a radio frequency (RF) signal to a receiver.

For some embodiments, the first upconverter module and the downconverter module may share a common, local oscillator. Further, in various embodiments, the first intermediate frequency signal may be the reference signal.

An exemplary method comprises receiving a first intermediate frequency signal, up-converting the first intermediate frequency signal to a radio frequency signal, amplifying a power of a signal based on the radio frequency signal (thereby resulting in an amplified radio frequency signal), and sampling a signal based on the amplified radio frequency signal. The method may further comprise down-converting a signal based on the sampled radio frequency signal to a second intermediate frequency signal, comparing a reference signal to a signal based on the second intermediate frequency signal, detecting a distortion of the amplified radio frequency signal based on the comparison of the reference signal to the signal based on the second intermediate frequency signal, and adjusting the first intermediate frequency signal using a linearizer module in order to reduce the distortion of the amplified radio frequency signal. Subsequently, the steps of up-converting, amplifying, sampling, down-converting, comparing and detecting may be repeated for the resulting adjusted first intermediate frequency signal or a signal based thereon. In some embodiments, the method may further comprise reducing a power level to a power amplifier used to amplify the power of the radio frequency signal during the amplifying step.

In some embodiments, detecting the distortion based on the comparison of the reference signal to the signal based on the second intermediate frequency signal may comprise generating an error function based on comparing the reference signal to the signal based on the second intermediate frequency signal. Further, in some embodiments, adjusting the first intermediate frequency signal using the linearizer module may comprise adjusting the first intermediate frequency signal based on the error function using the linearizer module. In particular, for some embodiments, adjusting the first intermediate frequency signal based on the error function using the linearizer module comprises adjusting the first intermediate frequency signal such that a result of the error function indicates minimal distortion of the amplified radio frequency signal.

In various embodiments, the method may further comprise determining a percentage of adjustment applied to the first intermediate frequency signal using the linearizer module in order to reduce the distortion of the amplified radio frequency signal. Additionally, the method may further comprise generating an alert when the percentage is greater than or equal to a threshold value.

For certain embodiments, a power amplifier may be used to amplify the power of the radio frequency signal during the amplifying step, where the power amplifier may contribute at least some of the distortion of the amplified radio frequency signal due to an output non-linearity characteristic of the power amplifier or due to a power level supplied to the power amplifier. Depending on the embodiment, the power amplifier may be a class C, a class AB, or a class A power amplifier.

Other features and aspects of some embodiments will become apparent from the following detailed description, taken in conjunction with the accompanying drawings, which illustrate, by way of example, the features in accordance with various embodiments.

BRIEF DESCRIPTION OF THE DRAWINGS

Various embodiments are described in detail with reference to the following figures. The drawings are provided for purposes of illustration only and merely depict some example embodiments. These drawings are provided to facilitate the reader's understanding of the various embodiments and shall not be considered limiting of the breadth, scope, or applicability of embodiments.

DETAILED DESCRIPTION OF THE EMBODIMENTS

Figure 1:
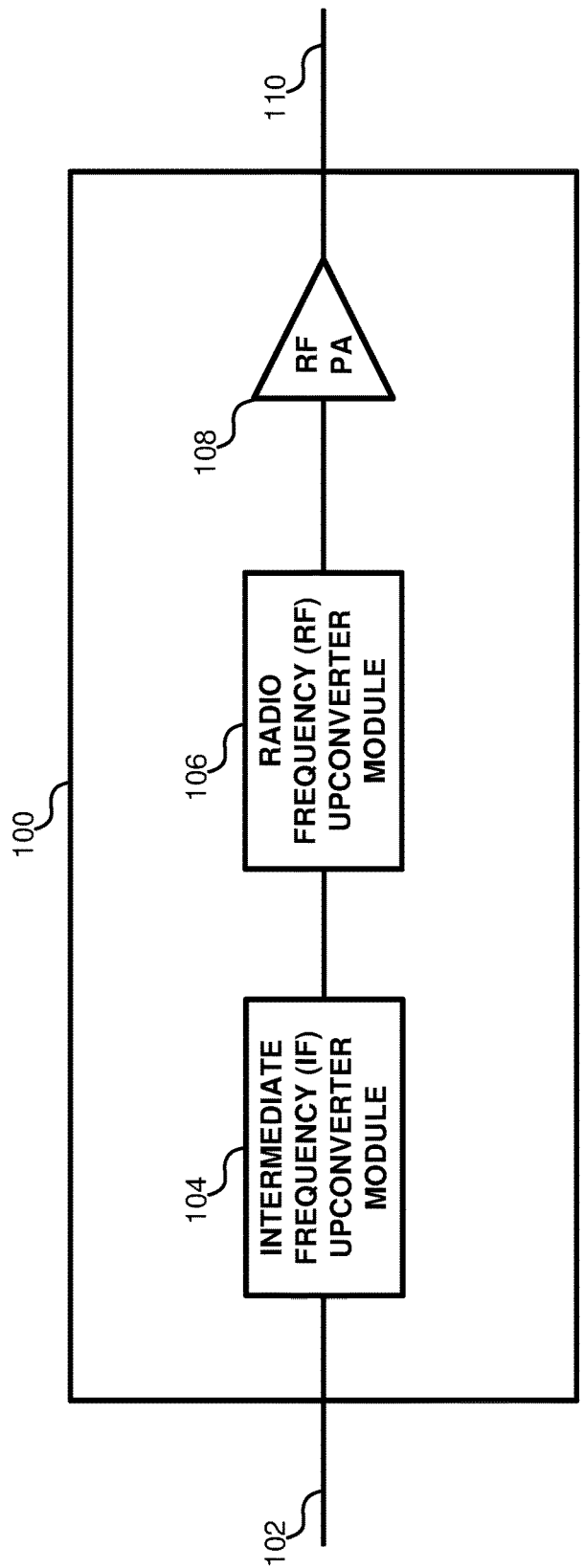
FIG. 1 depicts an example of a heterodyne transmitter found in the prior art.

A number of embodiments described herein relate to systems and methods that provide improved linearization for radio frequency (RF) transmitters, which may also enable improved power yield for RF transmitters. Additionally, some embodiments may enable an RF transmitter to optimize transmission performance despite normal changes in the RF transmitter's components (e.g., ambient temperature changes, component aging, or bias drift), and to achieve targeted transmission performance throughout an RF transmitter's product life.

Some embodiments may achieve improved radio frequency (RF) linearization in a radio frequency (RF) transmitter by using a linearization module to adjust a signal before the signal is amplified by a radio frequency (RF) power amplifier. For example, the linearization module in an RF transmitter may adjust an intermediate frequency (IF) signal before the IF signal is up-converted to a radio frequency (RF) signal and before the IF signal is amplified by a radio frequency (RF) power amplifier. Depending on the embodiment, the linearization module may be configured to adapt a signal according to a specific linearity and/or a compression curve based on the radio frequency (RF) output signal of the transmitter. For example, the linearization module may adapt the signal based on the performance of the RF signal being produced by the RF power amplifier in the RF transmitter. In particular, a output signal of the RF power amplifier may be provided to the linearization module as a feedback loop, which the linearization module in turn utilizes when adjusting a signal within the RF transmitter. Depending on the embodiment, the linearization module may employ a platform architecture that is compatible with a variety of frequency plans (e.g., microwave frequencies and millimeter frequencies).

Depending on the embodiment, improved RF linearization may be achieved while using a lower cost radio frequency (RF) power amplifier (e.g., off-the-shelf, surface mount technology (SMT) monolithic microwave integrated circuit (MMIC) power amplifier chip) and/or an RF power amplifier having lower performance capabilities. According to some embodiments, a radio frequency (RF) transmitter using a lower cost and/or lower quality RF power amplifier may achieve transmission performance at a middle or high end of a Gaussian distribution rather than at the low end of the Gaussian distribution (traditional transmitters that use a lower cost RF power amplifier usually exhibit low end performance). A radio frequency (RF) transmitter of some embodiments may utilize a lower cost RF power amplifier and/or an RF power amplifier having lower performance capabilities, while meeting a required transmission power yield. Additionally, with some embodiments, a radio frequency (RF) transmitter designer can reuse "failed" power amplifiers that generate lower power than expected, and can utilize a lower power RF power amplifier in place of an expensive rework process.

With improved RF linearization, some embodiments may achieve higher power yield from a given RF power amplifier than those embodiments would without the improved RF linearization. Further, improved RF linearization may be achieved while the RF power amplifier consumes low power or reduced power (i.e., the power amplifier operates in a "green mode"). With lower power consumption, some embodiments may increase the reliability, longevity of an RF power amplifier, and/or increase RF power amplifier efficiency.

Figure 2:
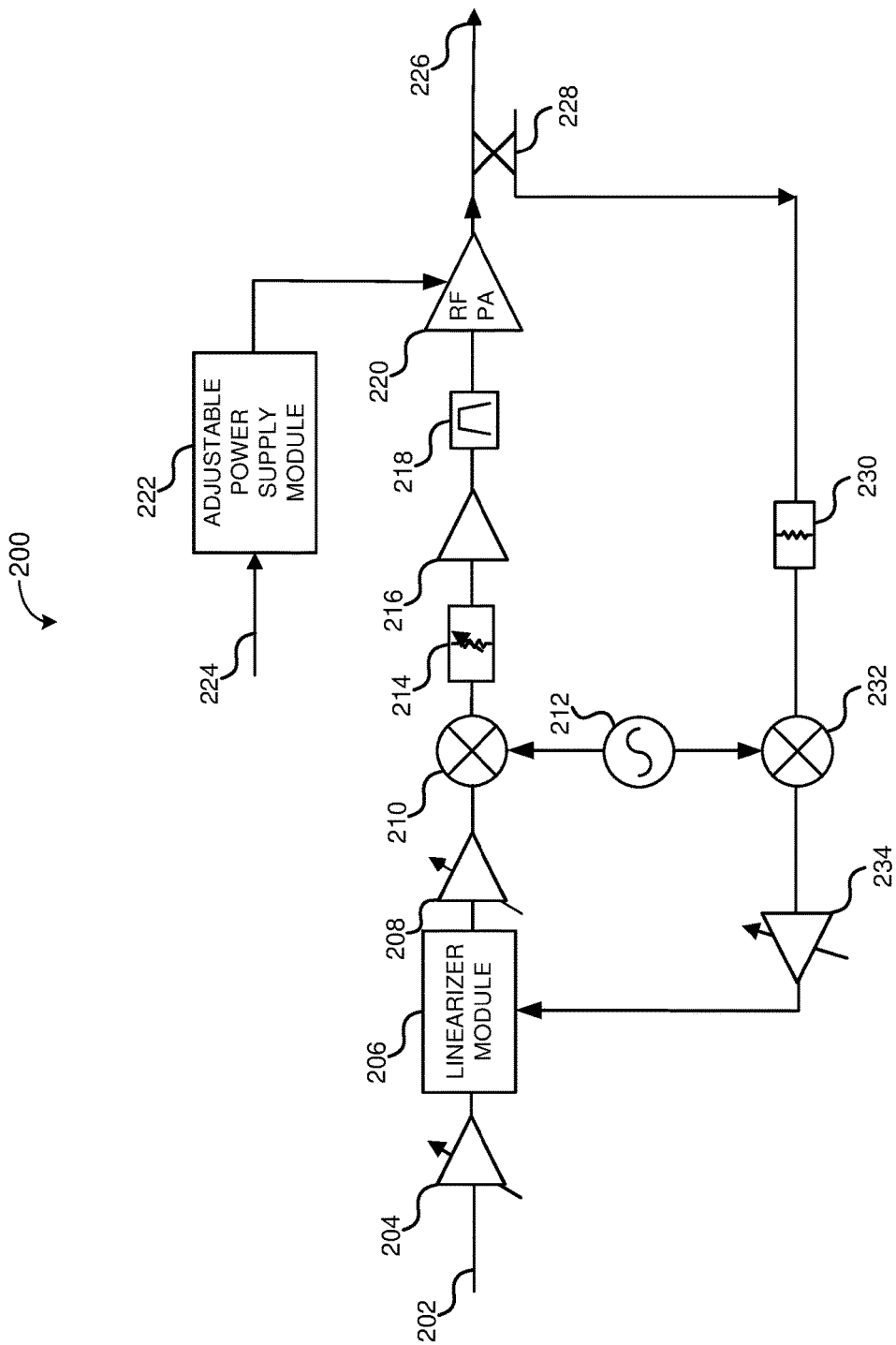
FIG. 2 is a block diagram of an example transmitter system in accordance with some embodiments.

FIG. 2 is a block diagram of an example transmitter system 200 in accordance with some embodiments. For some embodiments, the transmitter system 200 may be part of a radio frequency (RF) transmitter configured to generate an amplified radio frequency (RF) signal for wireless transmission. For instance, the transmitter system 200 may be a component contained within an outdoor unit (ODU) of a split-mount radio frequency (RF) system, where the split-mount RF system comprises the ODU and an indoor unit (IDU). Additional details regarding split-mount RF systems according to some embodiments will be discussed with respect to FIG. 5.

The transmitter system 200 may be configured to receive a first intermediate frequency (IF) signal, up-convert the first IF signal to a radio frequency (RF) signal, amplify the power of the RF signal to an amplified radio frequency (RF) signal, and then sample the amplified RF signal as feedback used to adjust the first intermediate frequency signal. In particular, the transmitter system 200 may sample the amplified RF signal, down-convert the sampled RF signal to a second intermediate frequency (IF) signal, compare a reference signal (e.g., a nearly ideal signal) to the second IF signal, detect a distortion of the amplified RF signal based on comparing the reference signal to the second IF signal, and then adjust the first IF signal using a linearizer module such that the adjusted first IF signal will result in an amplified RF signal with reduced distortion (e.g., reduce harmonics/intermodulation in adjacent frequencies, amplitude distortion, and/or phase distortion in the amplified RF signal). Depending on the embodiment, the reference signal may be the first IF signal or may be a signal constructed by methods known by those of skill in the art. After the first IF signal has been adjusted by the linearizer module, the steps of up-converting, amplifying, sampling, down-converting, comparing and detecting may be repeated for the adjusted first IF signal (i.e., the adjusted IF signal takes the place of the first IF signal).

The transmitter system 200 may comprise an intermediate frequency (IF) input terminal 202, variable gain amplifier modules 204, 208, and 234, a (power amplifier) linearizer module 206, mixer modules 210 and 232, a local oscillator module 212, a variable voltage attenuator module 214, a driver module 216, a filter module 218, a radio frequency (RF) power amplifier (PA) module 220, an adjustable power supply module 222, a voltage setting input terminal 224, an amplified radio frequency (RF) signal output terminal 226, a coupler module 228, and a fixed voltage attenuator module 230.

For some embodiments, the IF input terminal 202 may be coupled to the variable gain amplifier module 204; the linearizer modules 206 may be coupled to the variable gain amplifier modules 204 208, and 234; the mixer module 210 may be coupled to the variable gain amplifier module 208, the variable voltage attenuator module 214, and the local oscillator module 212; the driver module 216 may be coupled to the variable voltage attenuator module 214 and the filter module 218; and the RF power amplifier module 220 may be coupled to the filter module 218, the adjustable power supply module 222, and the RF signal output terminal 226. The coupler module 228 may coupled to the RF signal output terminal 226 and the fixed voltage attenuator module 230, and the mixer module 232 may be coupled to the fixed voltage attenuator module 230, the local oscillator module 212, and the variable gain amplifier module 234. Additionally, the voltage setting input terminal 224 may be coupled to the adjustable power supply module 222.

The intermediate frequency (IF) input terminal 202 may be configured to receive a first intermediate frequency (IF) signal intended for wireless transmission. In some embodiments, the IF input terminal 202 may receive the first IF signal from a modem module or some other component of the radio frequency (RF) transmitter (e.g., a filter module, or a digital signal process module). For certain embodiments, the first IF signal may comprise an in-phase (I) and quadrature (Q) signals, where the I and Q signals may be generated by a modem module or a digital signal processor module of the RF transmitter.

The variable gain amplifier module 204 may be configured to receive intermediate frequency (IF) signal from the intermediate frequency (IF) input terminal 202 and variably amplify the power of the IF signal before providing the IF signal to the linearizer module 206. In some embodiments, the variable gain amplifier modules 204, 208, and 234 may comprise an amplifier configured to variably amplify a signal. Depending on the embodiment, the variable gain amplifier modules 204, 208, and 234 may each comprise amplifiers of any kind and having different electrical properties.

Those skilled in the art will appreciate that each of the variable gain amplifier modules 204, 208, and 234 may be the same as one or more other variable gain amplifier modules discussed herein. For example, the variable gain amplifier modules 204, 208, and 234 may comprise an amplifier having the same electrical properties or, alternately, the variable gain amplifier modules 204, 208, and 234 may comprise amplifiers of different kinds having different electrical properties. Each of the variable gain amplifier modules 204, 208, and 234 may include one or more components. For instance, the variable gain amplifier module 204 may comprise one or more amplifiers.

The linearizer module 206 may be configured to receive and adjust the first intermediate frequency (IF) signal (or certain components thereof) in order to reduce the distortion of a radio frequency (RF) signal produced by the transmitter system 200. The linearizer module 206, for example, may adjust the first IF signal by generating and introducing/injecting distortion or some other form of noise into the first IF signal (e.g., by amplifying or attenuating components of the first IF signal) that would cancel out or mitigate distortion detected in the RF signal. For some embodiments, the linearizer module 206 may be configured to reduce distortion detected in an amplified radio frequency (RF) signal produced by the radio frequency (RF) power amplifier module 220.

To reduce the distortion, in some embodiments, the linearizer module may be configured to receive the first intermediate frequency (IF) signal from the variable voltage gain module 204, and generate an adjusted first IF signal based on one or more comparisons of a reference signal and a feedback signal of the transmitter system 200. For example, the linearizer module 206 may compare a reference signal to a sample of the radio frequency (RF) signal currently being generated by the transmitter system 200 (i.e., the feedback).

In some embodiments, the linearizer module 206 may be configured to compare the reference signal to the sampled radio frequency (RF) signal by generating an error function and, subsequently, adjusting the first intermediate frequency (IF) signal so that the generated error function is minimized. The linearizer module 206 may adjust the first IF signal such that the sampled RF signal resulting from the adjusted first IF signal minimizes the generated error function to zero. As noted herein, the adjustment to the first IF signal may comprise intentionally introducing/injecting distortion or other forms of noise into the first IF signal for the purpose of cancelling out or mitigating the distortion of the radio frequency (RF) signal.

Depending on the embodiment, the first IF signal may be the reference signal or, alternatively, the reference signal may be constructed from another reference signal within the transmitter system 200, such as the first IF signal or the data signal from which the first IF signal originates. Those of skill in the art will appreciate that where a reference signal is constructed, different methodologies known in the art may be utilized to construct the reference signal. Additionally, the sampled RF signal may originate from the amplified radio frequency (RF) signal currently being generated by the radio frequency (RF) power amplifier module 220. For some embodiments, the sampled RF signal may be first down-converted to a second intermediate frequency (IF) signal (e.g., by the mixer module 232) before being received by the linearizer module 206.

It should be noted that in some embodiments, where the sampled radio frequency (RF) signal originates from the signal currently being generated by the radio frequency (RF) power amplifier module 220, the linearizer module 206 may consider the amount of direct current (DC) power being supplied to the RF power amplifier module 220 (e.g., by the adjustable power supply module 222) when adjusting the first intermediate frequency (IF) signal. Additionally, if the DC power supplied to the RF power amplifier module 220 is ever adjusted (e.g., DC power adjusted so that the RF power amplifier module 220 is operating in "green mode"), the linearizer module 206 may compensate for any change in radio frequency (RF) signal distortion that results from the DC power adjustment.

In various embodiments, the linearizer module 206 may be configured to determine the amount (e.g., percentage) of change/adjustment being implemented to the first intermediate frequency (IF) signal and, subsequently, report the amount to a user or other components. The amount of change/adjustment may be used to measure the amount of distortion being produced in the transmitter system 200 (e.g., by the radio frequency amplifier module 220), and/or how much the linearizer module 206 is compensating for the distortion. Further, such information may indicate an error or component failure in the transmitter system 200, or possibly a design flaw in the transmitter system 200.

The linearizer module 206 may comprise a power amplifier linearizer to perform the adjustment of the first intermediate frequency (IF) signal. The linearizer module 206 may further comprise a control module configured to determine and/or report the percentage of change/adjustment implemented by the linearizer module 206 to the first IF signal, and an alarm module configured to generate an alert when the percentage of change/adjustment equals or surpasses a threshold value. Depending on the embodiment, the threshold value may be a value preset at the time of manufacturing, and/or may be user defined value that may be adjustable at any time. Where applicable, the linearizer module 206 may further comprise a reference signal module configured to construct the reference signal to which a sampled radio frequency (RF) signal is compared.

The linearizer module 206 may include one or more components. For example, the linearizer module 206 may comprise one or more linearizers.

Once the adjusted first intermediate frequency (IF) signal is generated by the linearizer module 206, the variable gain amplifier module 208 may variably amplify the power of the adjusted first IF signal before the adjusted first IF signal is received by the mixer module 210. The mixer module 210 may be configured to up-convert the first IF signal to a radio frequency (RF) signal (sometimes referred to as the final RF signal) using the oscillation signal from the local oscillator module 212. The mixer module 210 and the local oscillator module 212 may represent an upconverter module configured to perform the up conversion. Those skilled in the art will appreciate that there may be any number of upconverters configured to up-convert the signals within the transmitter system 200.

The mixer modules 210 and 232 may comprise mixers configured to mix the signal(s) provided by various components (e.g., the linearizer module 206, or the coupler module 228) with one or more other signals. The mixer modules 210 and 232 may comprise many different types of mixers with many different electrical properties. In one example, the mixer module 210 mixes the adjust first intermediate frequency (IF) signal from the linearizer module 206 and the variable gain amplifier module 208 with the oscillating signal provided by the local oscillator module 212. In another example, the mixer module 232 mixes a sampled radio frequency (RF) signal received from the fixed voltage attenuator module 230 and the coupler module 228 with the oscillating signal from the local oscillator module 212.

Those skilled in the art will appreciate that each of the mixers 210 and 232 may be the same as one or more other mixer modules. For example, mixer modules 210 and 232 may both be mixers sharing the same electrical properties or, alternately, the mixer modules 210 and 232 may be another kind of mixer and/or with different electrical properties. Each mixer modules 210 and 232 may include one or more components. For example, the mixer module 210 may comprise one or more mixers.

The local oscillator module 212 may comprise an oscillator configured to provide an oscillating signal that may be used to up-convert or down-convert a signal. The local oscillator module 212 may comprise any kind of oscillator. In some embodiments, the local oscillator module 212 provides an oscillating signal via a filter module (not shown). The local oscillator module 212 may include one or more components. For example, the oscillator module 212 may comprise one or more oscillators.

The variable voltage attenuator module 214 may be configured to receive a radio frequency (RF) signal from the mixer module 210 and variably attenuate the voltage of the RF signal before the RF signal is provided to the driver module 216. The variable voltage attenuator module 214 may comprise an attenuator configured to variably attenuate a signal. Additionally, the variable voltage attenuator module 214 may comprise any kind of attenuator. The variable voltage attenuator module 214 may include one or more components. For example, the variable voltage attenuator module 214 may comprise one or more attenuators.

The driver module 216 may be configured to receive the radio frequency (RF) signal from the variable voltage attenuator module 214 and regulate components of the RF signal, such as current or voltage, before the RF signal is provided to the filter module 218. The driver module 216 may comprise one or more amplifiers or resistors. The driver module 216 may include one or more components. For example, the driver module 216 may comprise one or more amplifiers.

The filter module 218 may be configured to receive the radio frequency (RF) signal from the variable voltage attenuator module 214 and filter the RF signal. The filter module 218 may comprise one or more filters configured to filter a signal. The filter module 218 may comprise many different types of filters (e.g., bandpass filter, low pass filter, high pass filter, or the like) with many different electrical properties. In one example, the filter module 218 may be a band pass filter configured to filter the RF signal (or components of the RF signal) provided from the driver module 216. The filter module 218 may include one or more components. For example, the filter module 418 may comprise one or more filters.

The radio frequency (RF) power amplifier module 228 is configured to receive the radio frequency (RF) signal form the filter module 218, amplify the power of the RF signal to an amplified radio frequency (RF) signal, and generate the amplified RF signal on the amplified radio frequency (RF) signal output terminal 226. The RF power amplifier 228 may be configured to variably amplify the RF signal based on one or more input settings. For example, the RF power amplifier 228 may variable amplify the RF signal based on the amount of direct current (DC) power the RF power amplifier 228 is supplied by the adjustable power supply module 222. The amplified RF signal output terminal 226 may be configured to provide the amplified RF signal to an antenna, possibly through one or more filters, waveguides, and/or diplexers.

For some embodiments, the type and/or amount of distortion in the RF signal caused by the RF power amplifier module 228 depends on the radio frequency (RF) power amplifier utilized by the RF power amplifier module 228. The RF power amplifier module 228 may comprise one or more of a variety of RF power amplifiers, each having similar or different electrical properties. For example, each of the RF power amplifiers may have different performance parameters and non-linearity output characteristics. The RF power amplifier may comprise one or more of a variety of transistor types (e.g., CMOS, or SiGe), and implement one of a number of amplifier architectures (e.g., class A, class AB or class C). For example, the RF power amplifier may be a lower cost and/or lower quality RF power amplifier, such as an off-the-shelf, surface mount technology (SMT) monolithic microwave integrated circuit (MMIC) power amplifier. Further, the RF power amplifier may perform at the low end of a Gaussian performance distribution in comparison to other RF power amplifiers.

The adjustable power supply module 222 may be configured to supply direct current (DC) power to the radio frequency (RF) power amplifier 228, and may adjust this supply of DC power based on the voltage setting input terminal 224. In some embodiments, the adjustable power supply module 222 may adjust a direct current (DC) bias power of the RF power amplifier module 228 based on the radio frequency (RF) power needed to transmit the radio frequency (RF) signal to a receiver. For some embodiments, the voltage setting input terminal 224 may be a voltage bias that corresponds to a specific level of output power by the adjustable power supply module 222. The adjustable power supply module 222 may include one or more components. For example, the adjustable power supply module 222 may comprise one or more transformers.

The coupler module 228 may be configured to sample the amplified radio frequency (RF) signal produced by the radio frequency (RF) power amplifier module 220, and provide the sampled radio frequency (RF) signal to the linearizer module 206 as feedback. In some embodiments, the coupler module 228 may be configured to sample the amplified RF signal after the signal has passed through one or more filters, waveguides, and/or diplexers. The coupler module 228 may comprise a directional coupler, which may be coupled to the radio frequency (RF) signal output terminal 226. The coupler module 228 may include one or more components. For example, the coupler module 228 may comprise one or more directional couplers.

The fixed voltage attenuator 230 may be configured to receive the sampled radio frequency (RF) signal from the coupler module 222 and attenuate the sampled RF signal before the sampled RF signal is received by the linearizer module 206. The fixed voltage attenuator 230 may comprise an attenuator configured to attenuate a signal at fixed level. The fixed voltage attenuator 230 may comprise any kind of attenuator. The fixed voltage attenuator 230 may include one or more components. For example, the fixed voltage attenuator 230 may comprise one or more attenuators.

The mixer module 232 may be configured to down-convert the sampled radio frequency (RF) signal to a second intermediate frequency (IF) signal using the oscillation signal from the local oscillator module 212. The mixer module 232 and the local oscillator module 212 may represent an downconverter module configured to perform the down conversion. Those skilled in the art will appreciate that there may be any number of downconverters configured to down-convert the signals within the transmitter system 200.

The variable gain amplifier 234 may be configured to variably amplify the power of the second intermediate frequency (IF) signal before the second IF signal is received by the linearizer module 206.

It will be appreciated that a "module" may comprise software, hardware, firmware, and/or circuitry. In one example one or more software programs comprising instructions capable of being executable by a processor may perform one or more of the functions of the modules described herein. In another example, circuitry may perform the same or similar functions. Alternative embodiments may comprise more, less, or functionally equivalent modules and still be within the scope of present embodiments. For example, the functions of the various modules may be combined or divided differently.

Figure 3:
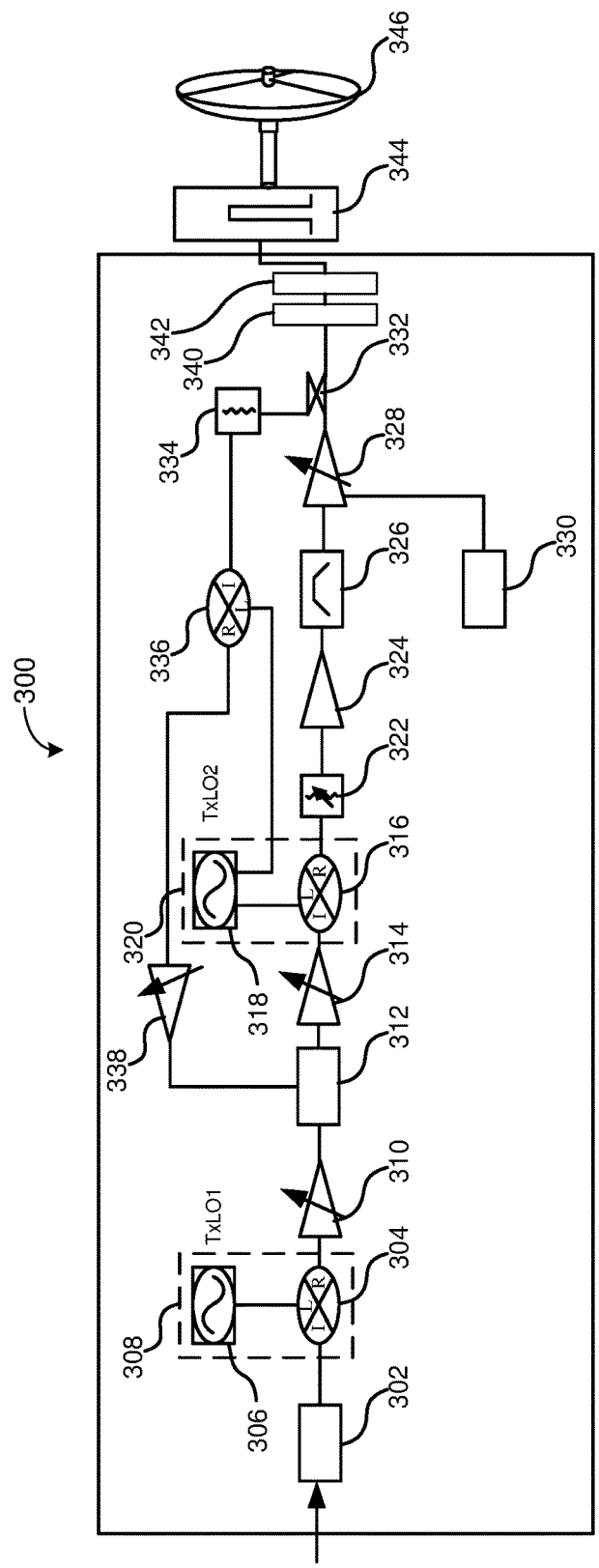
FIG. 3 is a block diagram of an example radio frequency (RF) transmitter in accordance with some embodiments.

FIG. 3 is a block diagram of an example radio frequency (RF) transmitter 300 in accordance with some embodiments. The RF transmitter 300 may be configured to reduce distortion in a radio frequency (RF) signal by adjusting an intermediate frequency (IF) signal before the IF signal is up-converted and amplified. The transmitter system 300 may comprise a modem module 302, mixer modules 304, 316, and 336, local oscillator modules 306 and 318, variable voltage gain amplifier modules 310, 314, and 338, a linearization module 312, a variable voltage attenuator module 322, a driver module 324, a filter module 326, a radio frequency (RF) power amplifier (PA) module 328, a fixed voltage attenuator module 334, an adjustable power supply module 330, a coupler module 332, a waveguide filter module 340, a waveguide module 342, a diplexer module 344, and an antenna 346.

In some embodiments, the mixer module 304 may be coupled to the modem module 302, the local oscillator module 306, and the variable gain amplifier module 310; the linearizer modules 312 may be coupled to the variable gain amplifier modules 310, 314, and 338; the mixer module 316 may be coupled to the variable gain amplifier module 314, the variable voltage attenuator module 322, and the local oscillator module 318; the driver module 324 may be coupled to the variable voltage attenuator module 322 and the filter module 326; and the RF power amplifier module 328 may be coupled to the filter module 326, the adjustable power supply module 330, and the waveguide filter module 340. The waveguide filter module 340 may be coupled to the waveguide module 343, Additionally, the waveguide module 343 may be coupled to the diplexer module 344, and the diplexer module 344 may be coupled to the antenna 346.

The coupler module 332 may be coupled to an output radio frequency (RF) from the RF power amplifier module 328, where the output RF is between the RF power amplifier module 318 and the waveguide filter module 340. Further, the coupler module 332 may be coupled to the fixed voltage attenuator module 334. The mixer module 336 may be coupled to the fixed voltage attenuator module 334, the local oscillator module 318, and the variable gain amplifier module 338.

The modem 302 may be any modem configured to receive one or more signals to be transmitted. The modem 302, in one example, may receive an in-phase (I) and quadrature (Q) signals and provide the signals to the mixer module 304.

The mixer module 304 and the local oscillator module 306 may represent an upconverter module 308 configured to up-convert the signals to a first intermediate frequency (IF) signal. Similarly, the mixer module 316 and the local oscillator module 318 also may represent an upconverter module 320 configured to further up-convert the signal to a radio frequency (RF) signal. Those skilled in the art will appreciate that there may be any number of upconverters configured to up-convert the signals within the radio frequency (RF) transmitter 300. Conversely, the mixer module 336 and the local oscillator module 318 may represent a downconverter configured to down-convert a sample of an amplified radio frequency (RF) signal to a second intermediate frequency (IF) signal.

The mixer modules 304, 316, and 336 may comprise mixers configured to mix the signal(s) provided by the modem with one or more other signals. The mixer modules 304, 316, and 336 may comprise many different types of mixers with many different electrical properties. In one example, the mixer 304 mixes I and Q signals received with the oscillating signal from the local oscillator module 306. In another example, the mixer module 316 mixes a signal received from the variable gain amplifier module 314 with the oscillating signal from the local oscillator module 318. In some embodiments, the mixer module 336 mixes the sample radio frequency (RF) signal from the coupler module 332 with the oscillator signal from the local oscillator module 318.

Those skilled in the art will appreciate that each of the mixers 304, 316, and 336 may be the same as one or more other mixer modules. For example, the mixer modules 304 and 316 may both be mixers sharing the same electrical properties or, alternately, the mixer modules 304 and 316 may be another kind of mixer and/or with different electrical properties. Each of the mixer modules 304, 316, and 336 may include one or more components. For example, the mixer module 304 may comprise one or more mixers.

The local oscillator modules 306 and 318 may comprise an oscillator configured to provide an oscillating signal that may be used to up-convert or down-convert a signal. The local oscillator modules 306 and 318 may comprise any kind of oscillator. In some embodiments, the local oscillator modules 306 and 318 provide an oscillating signal via a filter module (not shown). The local oscillator modules 306 and 318 may include one or more components. For example, the oscillator module 306 may comprise one or more oscillators.

The variable gain amplifier module 310 may be configured to receive the first intermediate frequency (IF) signal from the mixer module 304 and variably amplify the power of the first IF signal before providing the first IF signal to the linearizer module 306. In some embodiments, the variable gain amplifier modules 310, 314, and 338 may comprise an amplifier configured to variably amplify a signal. Depending on the embodiment, the variable gain amplifier modules 310, 314, and 338 may each comprise amplifiers of any kind and having different electrical properties.

Those skilled in the art will appreciate that each of the variable gain amplifier modules 310, 314, and 338 may be the same as one or more other variable gain amplifier modules discussed herein. For example, the variable gain amplifier modules 310, 314, and 338 may comprise an amplifier having the same electrical properties or, alternately, the variable gain amplifier modules 310, 314, and 338 may comprise amplifiers of different kinds having different electrical properties. Each of the variable gain amplifier modules 310, 314, and 338 may include one or more components. For instance, the variable gain amplifier module 310 may comprise one or more amplifiers.

The linearizer module 306 may be configured to receive and adjust the first intermediate frequency (IF) signal (or certain components thereof) in order to reduce the distortion of a radio frequency (RF) signal produced by the radio frequency (RF) transmitter 300. The linearizer module 306, for example, may adjust the first IF signal by generating and introducing/injecting distortion or some other form of noise into the first IF signal that would cancel out or mitigate distortion detected in the RF signal. For some embodiments, the linearizer module 306 may be configured to reduce distortion detected in an amplified radio frequency (RF) signal produced by the radio frequency (RF) power amplifier module 328.

To reduce the distortion, in some embodiments, the linearizer module may be configured to receive the first intermediate frequency (IF) signal from the variable voltage gain module 310, and generate an adjusted first IF signal based on one or more comparisons of a reference signal and a feedback signal of the radio frequency (RF) transmitter 300. For example, the linearizer module 306 may compare a reference signal to a sample of the radio frequency (RF) signal currently being generated to the antenna 346.

As noted herein, the linearizer module 306 may compare the reference signal to the sampled radio frequency (RF) signal by generating an error function and, subsequently, adjusting the first intermediate frequency (IF) signal so that the generated error function is minimized. The linearizer module 306 may adjust the first IF signal such that the sampled RF signal that resulting from the adjusted first IF signal minimizes the generated error function to zero. As noted herein, the adjustment to the first IF signal may comprise intentionally introducing/injecting distortion or other forms of noise into the first IF signal to cancel out or mitigate the distortion of the radio frequency (RF) signal.

Depending on the embodiment, the first IF signal may be the reference signal or, alternatively, the reference signal may be constructed from another reference signal within the transmitter system, such as the first IF signal or the data signal from which the first IF signal originates. Those of skill in the art will appreciate that where a reference signal is constructed, different methodologies known in the art may be utilized to construct the reference signal. Additionally, the sampled RF signal may originate from the amplified radio frequency (RF) signal currently being generated by the radio frequency (RF) power amplifier module 328. For some embodiments, the sampled RF signal may be first downconverted to a second intermediate frequency (IF) signal (e.g., by the mixer module 336) before being received by the linearizer module 306.

It should be noted that in some embodiments, where the sampled radio frequency (RF) signal originates from the signal currently being generated by the radio frequency (RF) power amplifier module 328, the linearizer module 306 may consider the amount of direct current (DC) power being supplied to the RF power amplifier module 328 (e.g., by the adjustable power supply module 330) when adjusting the first intermediate frequency (IF) signal. Additionally, if the DC power supplied to the RF power amplifier module 328 is ever adjusted (e.g., DC power adjusted so that the RF power amplifier module 328 is operating in "green mode"), the linearizer module 306 may compensate for any change in radio frequency (RF) signal distortion that results from the DC power adjustment.

The linearizer module 306 may be configured to determine the amount of change/adjustment being implemented to the first intermediate frequency (IF) signal and report the amount to a user or other components. The amount of change/adjustment may be used to measure the amount of distortion being produced in the radio frequency (RF) transmitter 300 (e.g., by the radio frequency amplifier module 328), and/or how much the linearizer module 306 is compensating for the distortion (i.e., how hard the linearizer module 306). Additionally, such information may indicate an error or component failure in the RF transmitter 300, or possibly a design flaw in the RF transmitter 300.

The linearizer module 306 may comprise a power amplifier linearizer to perform the adjustment of the first intermediate frequency (IF) signal. The linearizer module 306 may further comprise a control module configured to determine and/or report the percentage of change/adjustment implemented by the linearizer module 306 to the first IF signal, and an alarm module configured to generate an alert when the percentage of change/adjustment equals or surpasses a threshold value. Depending on the embodiment, the threshold value may be a value preset at the time of manufacturing, and/or may be user defined value that may be adjustable at any time. Where applicable, the linearizer module 306 may further comprise a reference signal module configured to construct the reference signal to which a sampled radio frequency (RF) signal is compared.

The linearizer module 306 may include one or more components. For example, the linearizer module 306 may comprise one or more linearizers.

The variable gain amplifier module 314 may be configured to variably amplify the power of the adjusted first intermediate frequency (IF) signal before the adjusted first IF signal is received by the mixer module 316. The mixer module 316 may be configured to up-convert the first IF signal to a radio frequency (RF) signal using the oscillation signal from the local oscillator module 318. As noted herein, the mixer module 316 and the local oscillator module 318 may represent an upconverter module configured to perform the up conversion module 320.

The variable voltage attenuator module 322 may be configured to receive a radio frequency (RF) signal from the mixer module 316 and variably attenuate the voltage of the RF signal before the RF signal is provided to the driver module 324. The variable voltage attenuator module 322 may comprise an attenuator configured to variably attenuate a signal. The variable voltage attenuator module 322 may comprise any kind of attenuator. Further, the variable voltage attenuator module 322 may include one or more components. For example, the variable voltage attenuator module 322 may comprise one or more attenuators.

The driver module 324 may be configured to receive the radio frequency (RF) signal from the variable voltage attenuator module 322 and regulate components of the RF signal, such as current or voltage, before the RF signal is provided to the filter module 326. The driver module 324 may comprise one or more amplifiers or resistors. The driver module 324 may include one or more components. For example, the driver module 324 may comprise one or more amplifiers.

The filter module 326 may be configured to receive the radio frequency (RF) signal from the variable voltage attenuator module 324 and filter the RF signal. The filter module 326 may comprise one or more filters configured to filter a signal. The filter module 326 may comprise many different types of filters (e.g., bandpass filter, low pass filter, high pass filter, or the like) with many different electrical properties. For example, the filter module 326 may be a low pass filter configured to filter the RF signal (or components of the RF signal) provided from the driver module 324. The filter module 326 may include one or more components. For example, the filter module 326 may comprise one or more filters.

The radio frequency (RF) power amplifier module 328 is configured to receive the radio frequency (RF) signal form the filter module 326, amplify the power of the RF signal to an amplified radio frequency (RF) signal, and generate the amplified RF signal to the waveguide filter 340. The RF power amplifier 328 may be configured to variably amplify the RF signal based on one or more input settings. In one example, the RF power amplifier 328 may variable amplify the RF signal based on the amount of direct current (DC) power the RF power amplifier 328 is supplied by the adjustable power supply module 330.

For some embodiments, the type and/or amount of distortion in the RF signal caused by the RF power amplifier module 328 depends on the radio frequency (RF) power amplifier utilized by the RF power amplifier module 328. The RF power amplifier module 328 may comprise one or more of a variety of RF power amplifiers, each having similar or different electrical properties. For instance, each of the RF power amplifiers may have different performance parameters and non-linearity output characteristics. The RF power amplifier may comprise one or more of a variety of transistor types (e.g., CMOS, or SiGe), and implement one of a number of amplifier architectures (e.g., class A, class AB or class C). In one example, the RF power amplifier may be a lower cost and/or lower quality RF power amplifier, such as an off-the-shelf, surface mount technology (SMT) monolithic microwave integrated circuit (MMIC) power amplifier. Additionally, in comparison to other RF power amplifiers, the RF power amplifier may perform at the low end of a Gaussian performance distribution.

The adjustable power supply module 330 may be configured to supply direct current (DC) power to the radio frequency (RF) power amplifier 328. In some embodiments, the adjustable power supply module 330 may adjust a direct current (DC) bias power of the RF power amplifier module 328 based on the radio frequency (RF) power needed to transmit the radio frequency (RF) signal to a receiver. The adjustable power supply module 330 may include one or more components. For example, the adjustable power supply module 330 may comprise one or more transformers.

The coupler module 332 may be configured to sample the amplified radio frequency (RF) signal produced by the radio frequency (RF) power amplifier module 328, and provide the sampled radio frequency (RF) signal to the linearizer module 312 as feedback. The coupler module 332 may comprise a directional coupler, which may sample the amplified RF signal of the radio frequency (RF) power amplifier module 328 before the amplified RF signal reaches the waveguide filter module 340. In some embodiments, the coupler module 332 may be configured to sample the amplified RF signal after the signal has passed through one or more filters, waveguides, and/or diplexers. The coupler module 332 may include one or more components. For example, the coupler module 332 may comprise one or more directional couplers.

The fixed voltage attenuator 334 may be configured to receive the sampled radio frequency (RF) signal from the coupler module 332 and attenuate the sampled RF signal before the sampled RF signal is received by the linearizer module 312. The fixed voltage attenuator 334 may comprise an attenuator configured to attenuate a signal at fixed level. The fixed voltage attenuator 334 may comprise any kind of attenuator. The fixed voltage attenuator 334 may include one or more components. For example, the fixed voltage attenuator 334 may comprise one or more attenuators.

The mixer module 336 may be configured to down-convert the sampled radio frequency (RF) signal to a second intermediate frequency (IF) signal using the oscillation signal from the local oscillator module 318. The mixer module 336 and the local oscillator module 318 may represent an downconverter module configured to perform the down conversion. Those skilled in the art will appreciate that there may be any number of downconverters configured to down-convert the signals within the radio frequency (RF) transmitter 300.

The variable gain amplifier 338 may be configured to variably amplify the power of the second intermediate frequency (IF) signal before the second IF signal is received by the linearizer module 306.

Before the amplified radio frequency (RF) signal from the radio frequency (RF) power amplifier module 328 reaches the antenna 346, the amplified RF signal may pass through the waveguide filter module 340, the waveguide module 342, and/or a diplexer module 344. The waveguide filter module 340 may be any filter coupled to the waveguide module 342 and configured to filter the electromagnetic waves (e.g., remove noise). The waveguide module 342 may provide the signal to the antenna 346 via a diplexer module 344. The diplexer module 344 may provide the signal to the antenna 346. The waveguide module 342 may be any waveguide kind or type of waveguide. For example, the waveguide module 342 may be hollow or dielectric. In some embodiments, the waveguide module 342 comprises a rectangular to circular waveguide.

Figure 4:
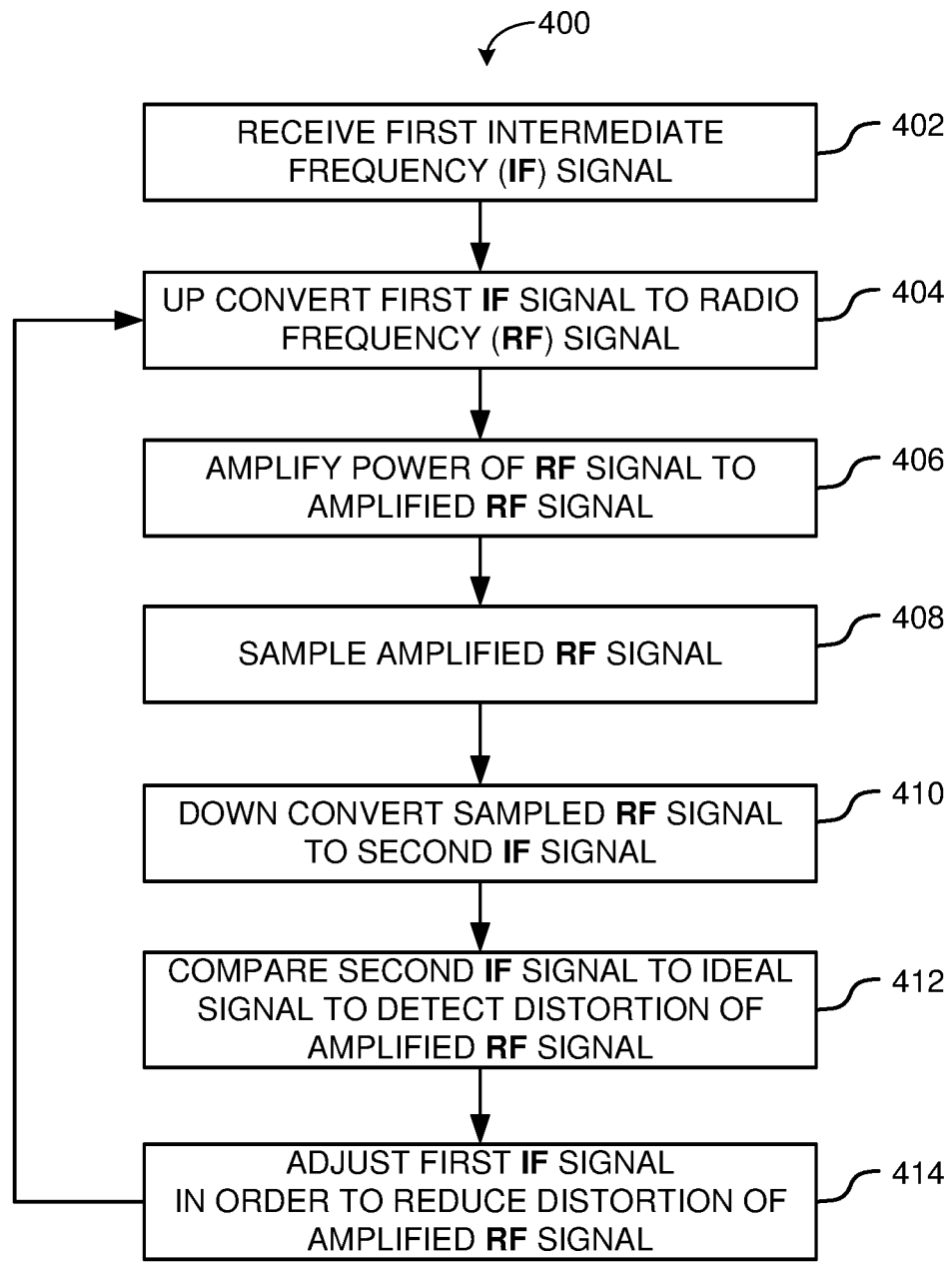
FIG. 4 is a flow chart of an example method for transmitting a signal in accordance with some embodiments.

FIG. 4 is a flow chart of an example method 400 for transmitting a signal in accordance with some embodiments. In step 402, a transmitter system 200 may receive a first intermediate frequency (IF) signal. In some embodiments, a linearizer module 206 may be the first component of the transmitter system 200 to receive the first IF signal. Generally, the linearizer module 206 may adjust the first IF signal upon receiving the first IF signal. However, when the transmitter system 200 is initially starting, the linearizer module 206 may be configured to allow the intermediate frequency first IF signal to pass unadjusted (as the there may be no meaningful feedback—i.e., sampled radio frequency signal—based on which the first IF signal can be adjusted). For example, the linearizer module 206 may be disabled when the transmitter system 200 first receives the first IF signal, and may remain disabled until such time as a meaningful radio frequency (RF) signal can be sampled. In some embodiments, the first IF signal may be provided by a modem module 302 and a first upconverter module 308.

In step 404, the mixer module 210 and the local oscillator module 212 may up-convert the first intermediate frequency (IF) signal from the linearizer module 206 to a radio frequency (RF) signal (e.g., a microwave frequency).

In step 406, the radio frequency (RF) power amplifier module 220 may receive the radio frequency (RF) signal, amplify a power of the RF signal, and generate an amplified radio frequency (RF) signal. In some embodiments, the RF power amplifier module 220 may amplify the power of the RF signal to an amount sufficient to achieve the desired wireless transmission. Generally, the RF power amplifier module 220 may introduce distortion into the amplified RF signal during the amplification process. As noted herein, the type and amount of distortion introduce into the amplified RF signal by the RF power amplifier module 220 may depend on the type of radio frequency (RF) amplifier utilized and/or the amount of power being supplied to the RF power amplifier module 220 by an adjustable power supply module 222. For example, if the power supplied to the RF power amplifier module 220 is reduced (e.g., in order to operate the RF power amplified module 220 with less power consumption-in "green mode"), the distortion introduced into the amplified RF signal by the RF power amplifier module 220 may increase. The linearizer module 206 may be configured to compensate and/or reduce such an increase in distortion.

In step 408, a coupler module 228 may sample the amplified radio frequency (RF) signal being produced by the radio frequency (RF) power amplifier module 220. As noted herein, the sampled radio frequency (RF) signal may be used by the linearizer module 206 to adjust the first intermediate frequency (IF) signal in order to reduce distortion detected in the amplified radio frequency (RF) signal. Those skilled in the art will appreciate that the RF signal may be sampled at any point between the RF power amplifier module 220 and an antenna.

In step 410, the mixer module 232 and the local oscillator module 212 may down-convert the sampled radio frequency (RF) signal from the coupler module 228 to a second intermediate frequency (RF) signal.

In step 412, the linearizer module 206 may compare the second intermediate frequency (IF) signal to a reference signal in order to detect the distortion of the amplified radio frequency (RF) signal. According to some embodiments, the linearizer module 206 compares the second IF signal to the reference signal and generates an error function. The error function may represent the distortion present in the amplified RF signal. For some embodiments, the reference signal may be the first intermediate frequency (IF) signal, or may be constructed using methodologies known to those skilled in the art.

In step 414, the linearizer module 206 may adjust the first intermediate frequency (IF) signal to reduce the distortion detected in the amplified radio frequency (RF) signal. In some embodiments, the linearizer module 206 may adjust the first IF signal such that the error function generated in step 412 is reduced or as low as possible. For example, the first IF signal may be adjusted by the linearizer module 206 such that the amplified RF signal that results from the adjusted first intermediate frequency (IF) signal is close to the reference signal. For some embodiments, the closer to the amplified RF signal is to the reference signal, the lower the error function that may be generated. Depending on the embodiment, the first IF signal may be adjusted by introducing distortions or other noise into the first IF signal that would, effectively, cancel out the distortion detected in the amplified RF signal and improve the linearity of the amplified RF signal.

Subsequent to step 414, steps 404 to 414 may be repeated with the adjusted first intermediate frequency (IF) signal replacing the current first intermediate frequency (IF) signal. In this manner, some embodiments are capable of adaptively adjusting the first IF signal in order to improve linearization of the amplified radio frequency (RF) signal produced by the radio frequency (RF) power amplifier module 220.

Figure 5:
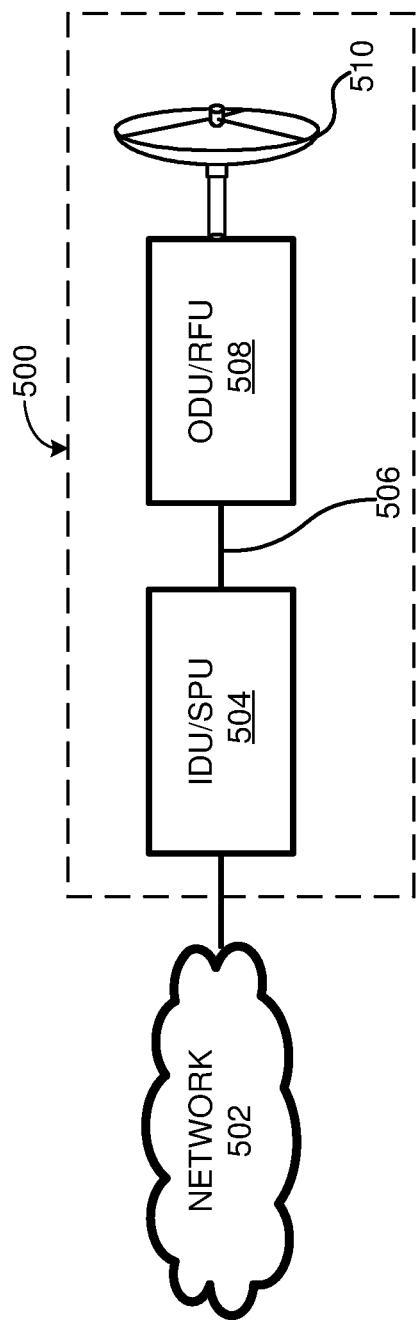
FIG. 5 is a block diagram of an example split-mount radio frequency (RF) system in accordance with some embodiments.

FIG. 5 is a block diagram of an example split-mount radio frequency (RF) system 500 in accordance with some embodiments. According to some embodiments, the split-mount RF system 500 implements a microwave communications system. The split-mount RF system 500 comprises an indoor unit (IDU)/signal processing unit (SPU) 504, a cable 506, an outdoor unit (ODU)/radio frequency unit (RFU) 508, and an antenna 510. The split-mount RF system 500 couples to a network 502, and facilitates communications between the network 502 and a network at a remote site.

The IDU/SPU 504 may function as the signal processing unit (SPU) for the split-mount RF system 500. Generally, locating the signal processing equipment in the IDU/SPU 504 helps minimize the amount of equipment that has to be located in the ODU/RFU 508, which is usually closer to the antenna 510. Additionally, locating the signal processing equipment in the IDU/SPU 504 allows for easier access, maintenance, and replacement of such signal processing equipment. For some embodiments, the IDU/SPU 504 comprises a digital signal processor module, a combiner/splitter module, a modem module, a power supply modules, and possibly auxiliary components/modules (e.g., for redundancy).

The IDU/SPU 504 is coupled to the ODU/RFU 508 via the cable 506. The ODU/RFU 508 may function as the radio frequency units (RFU) for the split-mount RF system 500 and, as such, may include the intermediate frequency (IF) and radio frequency (RF) equipment needed to transmit and receive wireless signals over a wireless channel. For example, in some embodiments, the ODU/RFU 508 comprises two or more transceivers modules, and a transducer module that connects to the antenna (510 and 520).

Additionally, in some embodiments, the ODU/RFU 508 comprises a linearizer module configured to reduce distortion in the radio frequency (RF) signal being provided to the antenna 510. For example, the ODU/RFU 508 may comprise a transmitter system similar to that of FIG. 2. The ODU/RFU 508 may be configured to receive an intermediate frequency (IF) signal (e.g., intermediate frequency signal from the IDU/SPU 504), up-convert the first IF signal to a radio frequency (RF) signal, amplify a power of the RF signal to an amplified radio frequency (RF) signal, sample the RF signal as feedback, and use a linearizer module to adjust the IF signal, based on the feedback, in order to reduce the distortion in the RF signal. For some embodiments, the adjustment to the IF signal may be based on comparing the sampled RF signal to a reference signal. By placing the linearizer module within the ODU/RFU 508 rather than IDU/SPU 504, some embodiments are able to reduce distortion in the RF signal within the ODU/RFU 508 without the need to send a sampled RF signal back to the IDU/SPU 504, and without the need to adjust baseband signals (e.g., which may be provided to or generated in the IDU/SPU 504).

As previously discussed herein, the RF signal sampled may be the amplified radio frequency (RF) signal produced by a radio frequency (RF) power amplifier utilized by and contained within the ODU/RFU 508. Further, depending on the embodiment, the reference signal may be the IF signal, a signal constructed within the ODU/RFU 508 from another reference signal (e.g., the IF signal), or a signal provided by the IDU/SPU 504 (e.g., a data signal provided by a modem or a digital signal processor module).

Generally, the ODU/RFU 508 is responsible for converting an intermediate frequency (IF) signal from the IDU/SPU 504 into corresponding wireless signal(s) to be transmitted via the antenna 510, and converting wireless signal(s) received via the antenna 510 into a corresponding intermediate frequency (IF) signal to be processed by the IDU/SPU 504. The antenna 510 may be configured to transmit and receive wireless signals.

While the embodiments describe in FIG. 5 are described in the context of a split mount radio frequency (RF) system, some embodiments may be implemented in other wireless communications system, including indoor-only systems, and cellular phone systems, WiFi systems, and the like.

The above-described functions and components can be comprised of instructions that are stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accordance with some embodiments. Those skilled in the art are familiar with instructions, processor(s), and storage medium.

Various embodiments are described herein as examples. It will be apparent to those skilled in the art that various modifications may be made and other embodiments can be used without departing from the broader scope of the present invention. Therefore, these and other variations upon the exemplary embodiments are intended to be covered by the present invention(s).

The invention claimed is:

1. A system, comprising:
  a linearizer configured to receive a first intermediate frequency transmit signal, to receive a first intermediate frequency feedback signal, to compare a reference signal to the first intermediate frequency feedback signal to determine first distortion, to generate first predistortion based on the first distortion, and to apply the first predistortion to a future intermediate frequency transmit signal to produce an adjusted future intermediate frequency transmit signal, the linearizer including a control module configured to evaluate an amount based on the first distortion or based on the first predistortion to determine whether to signal at least one other component in the system;
  an upconverter configured to upconvert a second signal to produce a first radio frequency transmit signal, the second signal being based on the first intermediate frequency transmit signal;
  a radio frequency power amplifier configured to amplify a third signal to produce an amplified radio frequency transmit signal, the third signal being based on the first radio frequency transmit signal, the radio frequency power amplifier causing second distortion in the amplified radio frequency transmit signal, the first distortion having been caused at least in part by the second distortion;
  a signal sampler configured to generate a first radio frequency feedback signal based on the amplified radio frequency transmit signal, the signal sampler having generated the first radio frequency feedback signal before the linearizer added the first predistortion to the future intermediate frequency transmit signal; and
  a downconverter configured to downconvert a fourth signal to produce a fifth signal, the fourth signal being based on the first radio frequency feedback signal, the first intermediate frequency feedback signal being based on the fifth signal.

2. The system of claim 1, wherein the reference signal is based on the first intermediate frequency transmit signal.

3. The system of claim 1, wherein the reference signal is received from an external source.

4. The system of claim 1, further comprising a control module configured to evaluate an amount based on the first distortion or based on the first predistortion to determine whether to trigger an alarm condition.

5. The system of claim 4, wherein the control module is further configured to determine a percentage of adjustment applied to the first intermediate frequency transmit signal to reduce the second distortion in the amplified radio frequency transmit signal, and further configured to generate an alert when the percentage of adjustment is greater than or equal to a threshold value.

6. The system of claim 1, wherein the radio frequency power amplifier contributes at least some of the second distortion in the amplified radio frequency transmit signal due to an output non-linearity characteristic of the radio frequency power amplifier.

7. The system of claim 1, wherein the radio frequency power amplifier comprises a class C, a class AB, or a class A power amplifier.

8. The system of claim 1, wherein the radio frequency power amplifier comprises an adjustable power supply configured to provide an adjustable power level to the radio frequency power amplifier, and wherein the radio frequency power amplifier contributes at least some of the second distortion in the amplified radio frequency transmit signal due to the adjustable power level the adjustable power supply provides to the radio frequency power amplifier.

9. The system of claim 8, wherein the radio frequency power amplifier is configured to use the adjustable power supply to reduce a power level utilized by the radio frequency power amplifier.

10. The system of claim 1, wherein the signal sampler comprises a directional coupler.

11. A method, comprising:
  receiving, by a linearizer, a first intermediate frequency transmit signal;
  receiving, by the linearizer, a first intermediate frequency feedback signal;
  comparing, by the linearizer, a reference signal to the first intermediate frequency feedback signal to generate a first distortion;
  determining, by the linearizer, first predistortion based on the first distortion;
  evaluating an amount based on the first distortion or based on the first predistortion to determine whether to signal at least one other component in the system;
  upconverting a second signal to produce a first radio frequency transmit signal, the second signal being based on the first intermediate frequency transmit signal;
  amplifying, by a radio frequency power amplifier, a third signal to produce an amplified radio frequency transmit signal, the third signal being based on the first radio frequency transmit signal, the radio frequency power amplifier causing second distortion in the amplified radio frequency transmit signal, the first distortion having been previously caused at least in part by the second distortion;

generating a first radio frequency feedback signal based on the amplified radio frequency transmit signal;

downconverting a fourth signal to produce a fifth signal, the fourth signal being based on the first radio frequency feedback signal, the first intermediate frequency feedback signal being based on the fifth signal; and adding, by the linearizer, the first predistortion to a future intermediate frequency transmit signal to produce an adjusted future intermediate frequency transmit signal.

12. The method of claim 11, wherein the reference signal is based on the first intermediate frequency transmit signal.

13. The method of claim 11, wherein the reference signal is received from an external source.

14. The method of claim 11, further comprising:
evaluating an amount based on the first distortion or based on the first predistortion to determine whether to trigger an alarm condition; and
triggering an alarm condition based on the amount of the first distortion or the first predistortion.

15. The method of claim 14, wherein the step of evaluating the amount comprises determining a percentage of adjustment applied to the first intermediate frequency transmit signal to reduce the second distortion in the amplified radio frequency transmit signal, and further comprising generating an alert when the percentage of adjustment is greater than or equal to a threshold value.

16. The method of claim 11, wherein the second distortion includes an output non-linearity characteristic of the radio frequency power amplifier.

17. The method of claim 11, wherein the radio frequency power amplifier comprises a class C, a class AB, or a class A power amplifier.

18. The method of claim 11, further comprising providing an adjustable power level to the radio frequency power amplifier.

19. The method of claim 18, further comprising modifying the adjustable power level, thereby affecting the second distortion.

20. The method of claim 11, wherein the generating the first radio frequency feedback signal is performed using a directional coupler.

21. A system, comprising:
linearizer means for receiving a first intermediate frequency transmit signal and a first intermediate frequency feedback signal, for comparing a reference signal to the first intermediate frequency feedback signal to generate a first distortion, for determining first predistortion based on the first distortion, for adding the first predistortion to a future intermediate frequency transmit signal to produce an adjusted future intermediate frequency transmit signal, and for evaluating an amount based on the first distortion or based on the first predistortion to determine whether to signal at least one other component in the system;

means for upconverting a second signal to produce a first radio frequency transmit signal, the second signal being based on the first intermediate frequency transmit signal;

radio frequency power amplifier means for amplifying a third signal to produce an amplified radio frequency transmit signal, the third signal being based on the first radio frequency transmit signal, the radio frequency power amplifier causing second distortion in the amplified radio frequency transmit signal, the first distortion having been previously caused at least in part by the second distortion;

means for generating a first radio frequency feedback signal based on the amplified radio frequency transmit signal before the linearizer means adds the first predistortion to the future intermediate frequency transmit signal; and means for downconverting a fourth signal to produce a fifth signal, the fourth signal being based on the first radio frequency feedback signal, and the first intermediate frequency feedback signal being based on the fifth signal.

* * * * *